: US 8,987,707 B2
(45) Date of Patent: Mar. 24, 2015

(54) STRETCHABLE TRANSISTORS WITH BUCKLED CARBON NANOTUBE FILMS AS CONDUCTING CHANNELS

(71) Applicant: Wisconsin Alumni Research Foundation, Madison, WI (US)

(72) Inventors: Michael S. Arnold, Middleton, WI (US); Feng Xu, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 13/971,177

(22) Filed: Aug. 20, 2013

(65) Prior Publication Data

US 2015/0053927 A1 Feb. 26, 2015

(51) Int. Cl.
H01L 29/78 (2006.01)
H01L 29/775 (2006.01)
H01L 29/66 (2006.01)

(52) U.S. Cl.
CPC ........ H01L 29/775 (2013.01); H01L 29/66439 (2013.01); *Y10S 977/938* (2013.01)
USPC ......... 257/29; 257/E51.04; 977/938; 438/151

(58) Field of Classification Search
USPC ........................ 257/29, E51.04; 977/936, 938
See application file for complete search history.

(56) References Cited

U.S. PATENT DOCUMENTS

| 6,743,982 | B2* | 6/2004 | Biegelsen et al. ................ 174/69 |
| 7,579,223 | B2* | 8/2009 | Wada et al. ................... 438/151 |
| 7,851,294 | B1* | 12/2010 | Basco et al. ................... 438/211 |
| 8,389,862 | B2* | 3/2013 | Arora et al. ..................... 174/254 |
| 8,536,667 | B2* | 9/2013 | de Graff et al. ................ 257/419 |
| 8,809,844 | B2* | 8/2014 | Park et al. ......................... 257/40 |
| 8,886,334 | B2* | 11/2014 | Ghaffari et al. ............... 607/115 |
| 2004/0192082 | A1* | 9/2004 | Wagner et al. ................... 439/67 |
| 2006/0038182 | A1* | 2/2006 | Rogers et al. .................... 257/77 |
| 2006/0169989 | A1* | 8/2006 | Bhattacharya et al. .......... 257/79 |
| 2006/0286785 | A1* | 12/2006 | Rogers et al. ................... 438/584 |
| 2008/0157235 | A1* | 7/2008 | Rogers et al. .................. 257/415 |
| 2008/0191200 | A1* | 8/2008 | Frisbie et al. .................... 257/40 |
| 2010/0002402 | A1* | 1/2010 | Rogers et al. ................... 361/749 |
| 2010/0052112 | A1* | 3/2010 | Rogers et al. .................. 257/625 |
| 2011/0057168 | A1* | 3/2011 | Kobayashi ....................... 257/24 |
| 2011/0121273 | A1* | 5/2011 | Jo et al. ............................ 257/40 |
| 2012/0261646 | A1* | 10/2012 | Zhou et al. ....................... 257/29 |
| 2012/0326127 | A1* | 12/2012 | Chang et al. ..................... 257/29 |
| 2013/0203198 | A1* | 8/2013 | Min et al. ......................... 438/46 |
| 2014/0150859 | A1* | 6/2014 | Zakhidov et al. .............. 136/255 |
| 2014/0233297 | A1* | 8/2014 | Ozyilmaz et al. ............. 365/145 |
| 2014/0266391 | A1* | 9/2014 | Parkin et al. ................... 327/365 |

OTHER PUBLICATIONS

F. Xu, Chapter five from the doctoral thesis of Feng Xu, accessioned at the North Carolina State University Library on Sep. 6, 2012.

(Continued)

Primary Examiner — Earl Taylor
(74) Attorney, Agent, or Firm — Bell & Manning, LLC

(57) ABSTRACT

Thin-film transistors comprising buckled films comprising carbon nanotubes as the conductive channel are provided. Also provided are methods of fabricating the transistors. The transistors, which are highly stretchable and bendable, exhibit stable performance even when operated under high tensile strains.

14 Claims, 18 Drawing Sheets

(56) References Cited

OTHER PUBLICATIONS

Lacour et al., Stretchable Interconnects for Elastic Electronic Surfaces, Proceedings of the IEEE, vol. 93, No. 8, Aug. 2005, pp. 1459-1467.

Lacour et al., Stretchable gold conductors on elastomeric substrates, Applied Physics Letters, vol. 82, No. 15, Apr. 14, 2003, pp. 2404-2406.

Kim et al., High-Performance Flexible Graphene Field Effect Transistors with Ion Gel Gate Dielectrics, Nano Letters, vol. 10, Aug. 12, 2010, pp. 3464-3466.

Fu et al., Tunable Nanowrinkles on Shape Memory Polymer Sheets, Adv. Mater., vol. 21, 2009, pp. 4472-4476.

Zhu et al., Buckling of Aligned Carbon Nanotubes as Stretchable Conductors: A New Manufacturing Strategy, Adv. Mater., vol. 24, Jan. 23, 2012, pp. 1073-1077.

Xu et al., Wavy Ribbons of Carbon Nanotubes for Stretchable Conductors, Adv. Mater., vol. 22, Jan. 19, 2012, pp. 1279-1283.

Chae et al., Transferred wrinkled $Al_2O_3$ for highly stretchable and transparent graphene-carbon nanotube transistors, Nature Materials, vol. 12, Mar. 3, 2013, pp. 403-409.

* cited by examiner

US 8,987,707 B2

STRETCHABLE TRANSISTORS WITH BUCKLED CARBON NANOTUBE FILMS AS CONDUCTING CHANNELS

REFERENCE TO GOVERNMENT RIGHTS

This invention was made with government support under W911NF-12-1-0025 awarded by the ARMY/ARO and DE-SC0006414 awarded by the U.S. Department of Energy. The government has certain rights in the invention.

BACKGROUND

Recently, progress has been made in the development of stretchable electronics. Many unconventional applications such as implantable biosensors, wearable electronics and stretchable displays have been made possible by such electronics. Yet most of important stretchable electronic components such as transistors are still based on silicon materials. Few efforts have been successful in utilizing other semiconductor materials to configure stretchable transistors.

SUMMARY

Stretchable thin-film transistors comprising buckled films of single-walled carbon nanotubes (SWCNTs) as the conductive channel are provided. Also provided are methods of fabricating the transistors.

One embodiment of a stretchable transistor comprises a source electrode; a drain electrode; a conducting channel disposed between the source electrode and the drain electrode; a gate dielectric comprising a stretchable polymeric dielectric material disposed over the conducting channel; a gate electrode in electrical communication with the conducting channel; and a stretchable substrate comprising an elastic material disposed under the conducting channel. In the transistors, the conducting channel comprising a buckled film comprising single-walled carbon nanotubes. In some embodiments of the transistors, one or more of the source electrode, the drain electrode and the gate electrode comprise buckled metal films.

One embodiment of a method of fabricating a stretchable transistor comprises the steps of applying a film comprising single-walled carbon nanotubes onto the surface of a stretchable substrate comprising an elastic material; stretching the stretchable substrate; allowing the stretched substrate with the film comprising the single-walled carbon nanotubes applied thereon to return to its un-stretched state, whereby the film comprising the single-walled carbon nanotubes becomes buckled; depositing a film of electrically conducting material over a portion of the stretchable substrate and the film comprising single-walled carbon nanotubes to form a source electrode; depositing a film of electrically conducting material over another portion of the stretchable substrate and the film comprising single-walled carbon nanotubes to form a drain electrode; and depositing a film of a stretchable polymeric dielectric material over the film comprising the single-walled carbon nanotubes between the source electrode and the drain electrode to form a gate dielectric.

The film comprising the single-walled carbon nanotubes can be applied to the stretchable substrate prior to stretching the substrate, such that the film and substrate are initially stretched together. Alternatively, the film comprising single-walled carbon nanotubes can be applied to the surface of a stretchable substrate while the stretchable substrate is in a pre-stretched state.

In some embodiments of the methods, the film of electrically conducting material that forms the source electrode and the film of electrically conducting material that forms the drain electrode are deposited while the stretchable substrate is in a stretched state, such that the films of electrically conducting material become buckled when the stretchable substrate is returned to its un-stretched state.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Thin-film transistors comprising buckled films of SWCNTs as the conductive channel are provided. Also provided are methods of fabricating the transistors. The transistors, which are highly stretchable and bendable, exhibit stable performance even when operated under high tensile strains.

The basic components of the transistors include a source electrode, a drain electrode and a conducting channel comprising a buckled film of SWCNTs between the source and drain electrodes. A gate dielectric comprising a stretchable polymeric dielectric material is disposed over the conducting channel and a gate electrode is provided in electrical communication with the conducting channel. These components are supported by a stretchable substrate comprising an elastic material, such as a polymeric elastomer. Like the film of the conducting channel, the source and drain electrodes may be buckled in order to increase the stretchability of the device.

Figure 4:
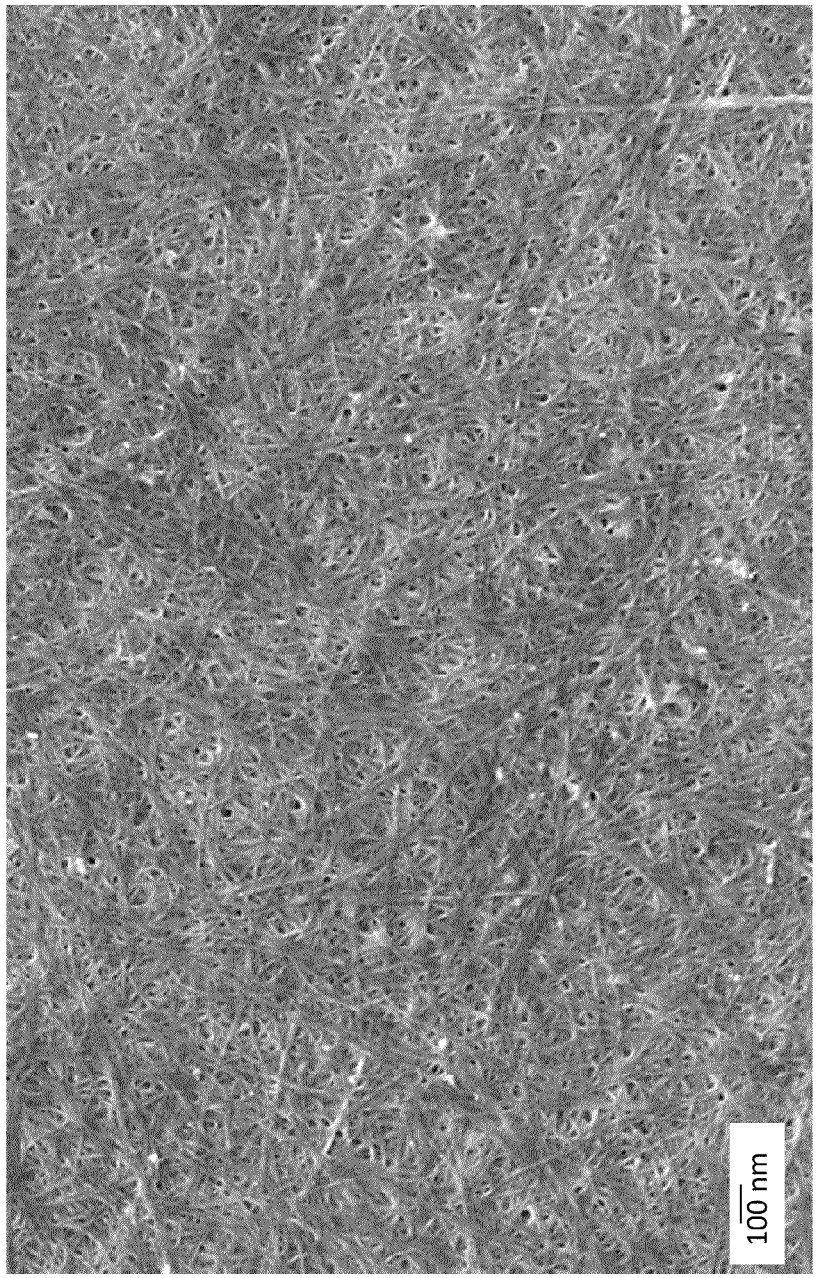
FIG. 4. Scanning electron microscope (SEM) image of an unbuckled film of SWCNTs after being transferred onto a PDMS substrate, as described in Example 1.
Figure 5:
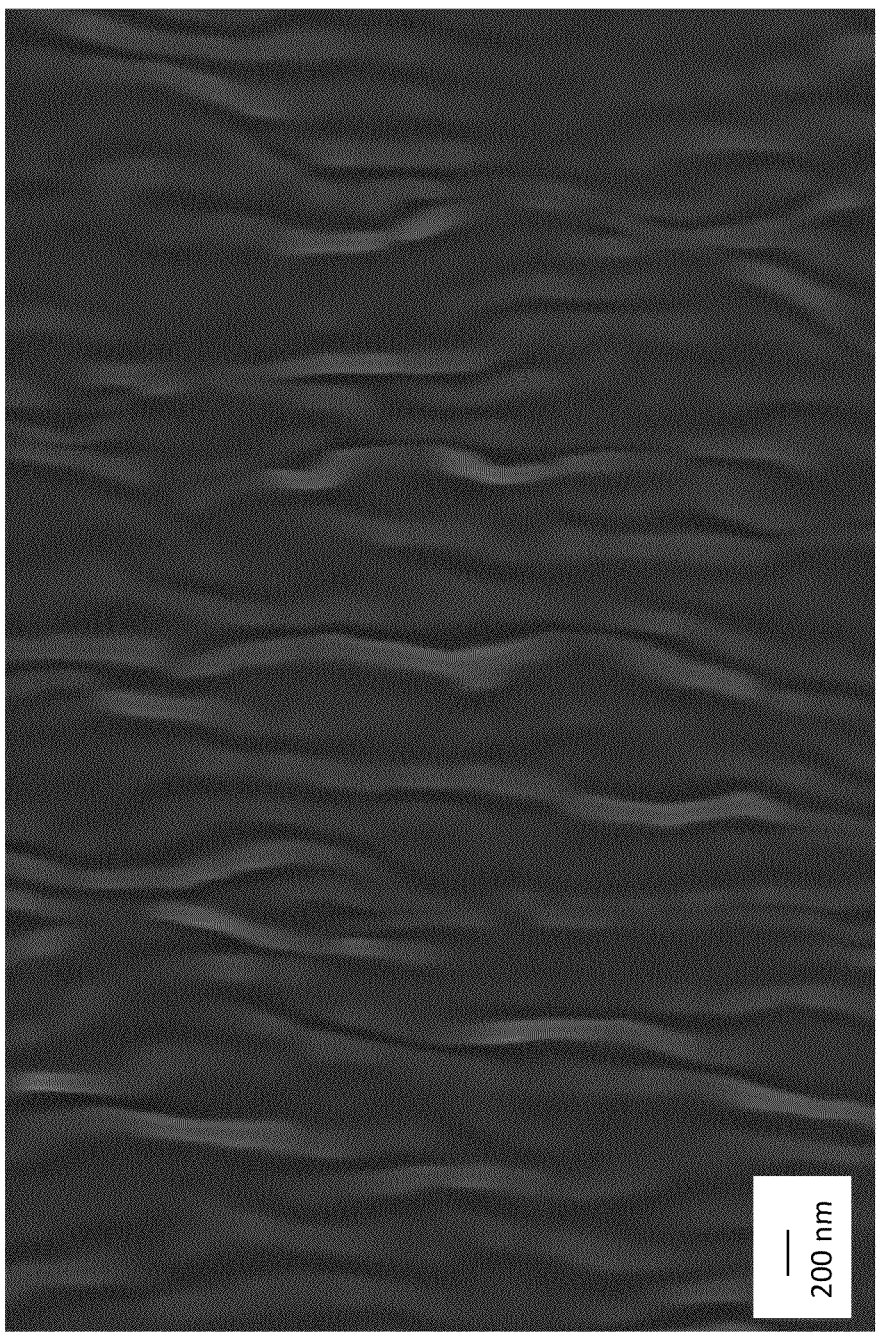
FIG. 5. SEM image of the film in FIG. 4 after buckling.

An initial step in the fabrication of the transistors is the formation of a buckled film comprising SWCNTs. This step can be carried out by forming a film comprising single-walled carbon nanotubes on the surface of a stretchable substrate. The film comprises a dense mat of SWCNTs, which are typically randomly oriented within the film. An example of one such film is shown in FIG. 4. To induce the buckling of the film of SWCNTs, the stretchable substrate is stretched to create a tensile strain in the substrate. The substrate may be stretched after the film of SWCNTs is applied to its surface. Alternatively, the film of SWCNTs may be applied to the surface of a pre-stretched substrate. Either way, when the tensile strain is released the stretched substrate with the film comprising the single-walled carbon nanotubes applied thereon returns to its un-stretched state and the film comprising the SWCNTs buckles. The buckled film is characterized by a series of uniaxial waves or 'wrinkles'. The dimensions of the wrinkles can be adjusted by adjusting the thickness and elasticity of the stretchable substrate. However, the dimensions are generally on the nanoscale with magnitudes and wavelengths of 1 μm or smaller (e.g., 500 nm or smaller). (It should be noted that the terms 'uniaxial' and 'waves' are not intended to imply that the wrinkles in the film are perfectly uniaxial or that the dimensions of the wrinkles are perfectly uniform. Thus, these terms also encompass wrinkles that are substantially uniaxial or substantially wave-like, as illustrated in FIG. 5.)

Figure 1:
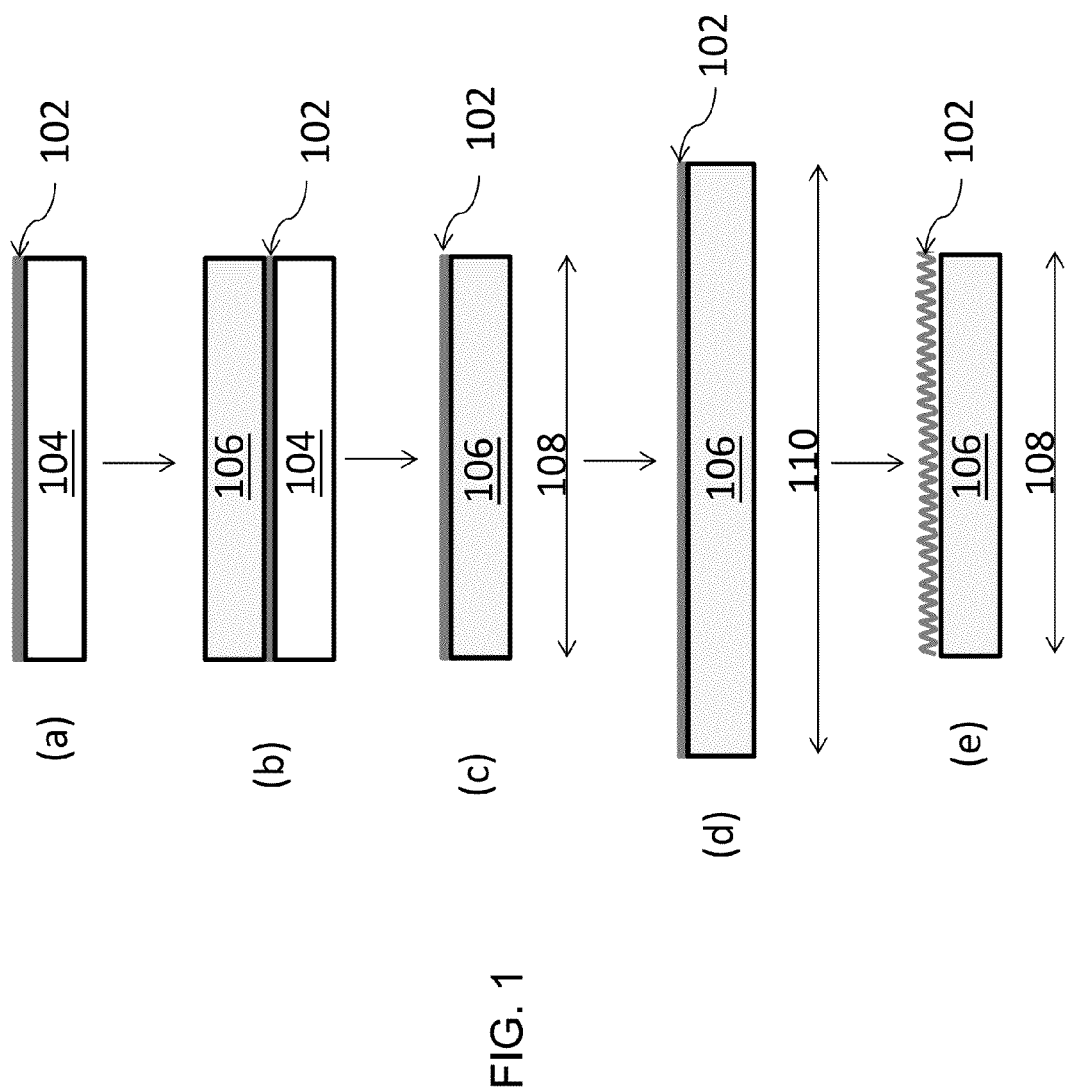
FIG. 1. Schematic diagram showing a process for the transfer and buckling of a film comprising SWCNTs.

One embodiment of a method of forming a buckled film comprising SWCNTs is shown schematically in FIG. 1. As shown in panel (a) of FIG. 1, the process begins with a thin film comprising SWCNTs 102 disposed on the surface of a support substrate 104. The thin film can be applied using methods, such as doctor-blading or spin-coating, in which a solution comprising the SWCNTs is spread onto the substrate and allowed to dry. The solution may contain one or more solvents and other additives, such as dispersing agents. Support substrate 104 need not be a stretchable, elastomeric substrate and may be comprised of a variety of materials. After the thin SWCNT film is formed, the film is transferred to the surface of a stretchable substrate 106 comprising an elastic material, such as polydimethylsiloxane (PDMS). As illustrated in panels (b) and (c) of FIG. 1, transfer of thin film 102 can be accomplished by pressing stretchable substrate 106 against thin film 102 and subsequently peeling stretchable substrate 106, along with thin film 102 away from support substrate 104. Next, stretchable substrate 106 and thin film 102 are stretched from an initial length (L) 108 to a stretched length (L+ΔL) 110 (panel (d)), whereby a tensile strain is created in the material. The strain is then released and stretchable substrate 106 allowed to return to its unstretched state resulting in the buckling of thin film 102, as illustrated in panel (e). The stretching step can be carried out using, for example, a uniaxial stretching device. Care should be taken not to overstretch the material in order to avoid the formation of cracks in the SWCNT film that would impair the performance of a transistor made therefrom. In some embodiments of the method the stretchable substrate is stretched to a tensile strain of up to 25%. Also included are embodiments in which the stretchable substrate is stretched to a tensile strain of up to 20% and embodiments in which the stretchable substrate is stretched to a tensile strain of up to 15%.

Figure 3:
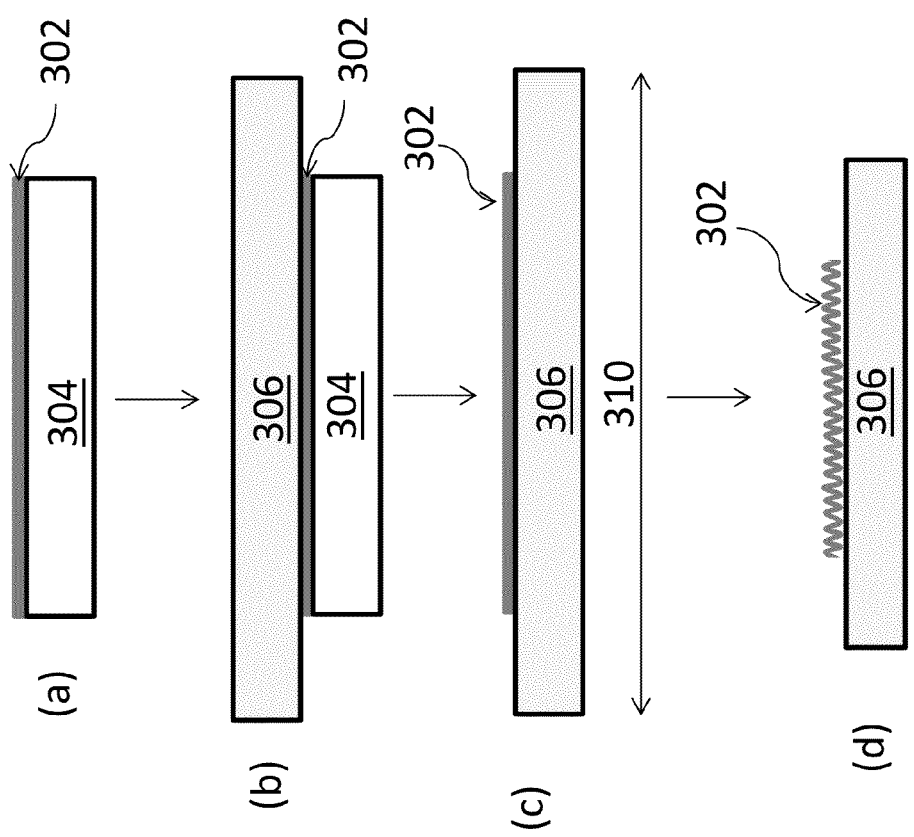
FIG. 3. Schematic diagram showing another embodiment of a process for the transfer and buckling of a film comprising SWCNTs.

An alternative embodiment of a method for forming a buckled thin film comprising SWCNTs on an elastic substrate is shown in FIG. 3. In this embodiment, a thin film comprising the SWCNTs 302 is formed on a support substrate 304, as in the embodiment of FIG. 1. However, prior to the transfer of thin film 302 from support substrate 304 to a stretchable elastic substrate 306, the stretchable substrate is pre-stretched to a length (L+ΔL) 310. Pre-stretched substrate 306 is then pressed against thin film 302, while in the pre-stretched state (panel (b). Stretchable substrate 306, along with thin film 302, is then peeled away from support substrate 304, as shown in panel (c). After the transfer of thin film 302 onto stretchable substrate 306, the strain is released and stretchable substrate 306 allowed to return to its unstretched state resulting in the buckling of thin film 302, as illustrated in panel (d). The advantage of this alternative embodiment of the method is that it allows for the use of a high pre-strain in the stretchable substrate without the risk of cracking the SWCNT film. As a result, transistors having conducting channels that incorporate buckled SWCNT films made in this manner are able to operate stably at higher strains. In some embodiments, the stretchable substrate is stretched to a tensile pre-strain of up to 60%. Also included are embodiments in which the stretchable substrate is stretched to a tensile pre-strain of up to 50% and embodiments in which the stretchable substrate is stretched to a pre-strain of up to 40%.

After the initial stretch and release (or pre-stretch and release) cycle, the stretchable substrate and the thin film of SWCNTs can be subjected to additional stretch and release cycles in order to stabilize the buckled structure of the SWCNT film. Typically, a lower stain is applied in these subsequent cycles, relative to that applied in the initial stretch (or initial pre-stretch).

Figure 2:
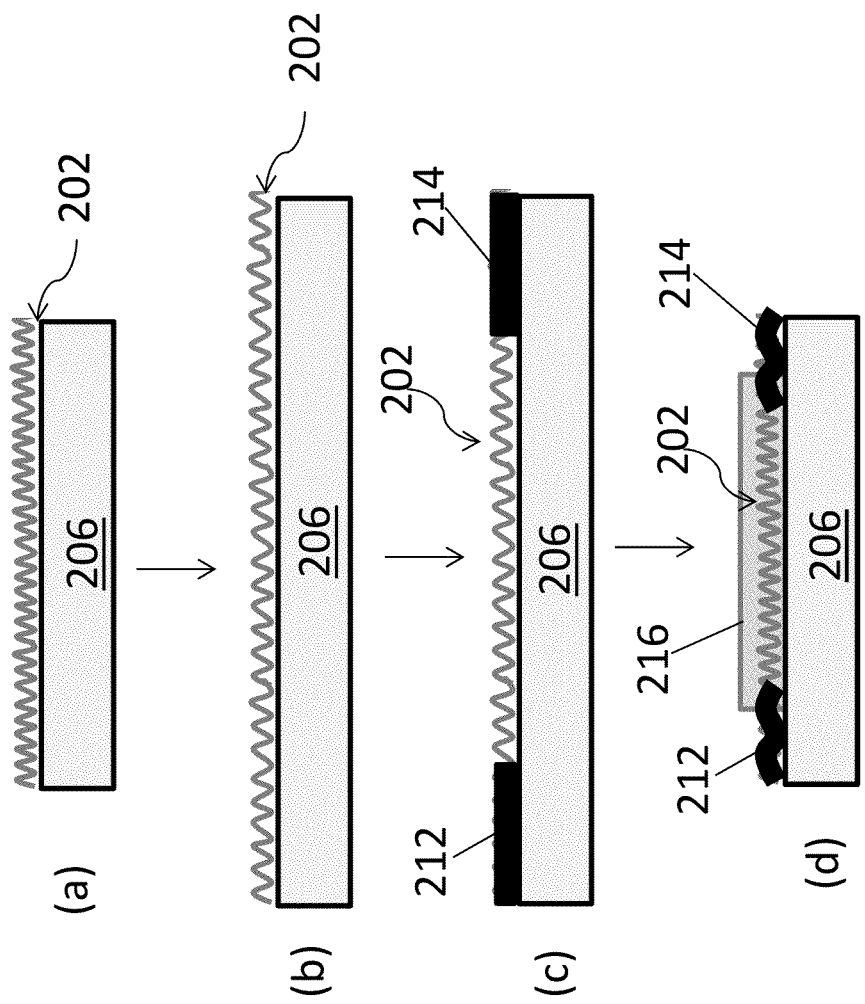
FIG. 2. Schematic diagram showing a process of fabricating a transistor incorporating a buckled SWCNT film as a conductive channel.

Once the buckled film comprising the SWCNTs is formed on the stretchable substrate, the remainder of the transistor can be fabricated. This is illustrated schematically in FIG. 2, starting with a stretchable substrate 206 having a buckled thin film comprising SWCNTs 202 disposed thereon (panel (a)). As illustrated in panels (b) and (c) of FIG. 2, the transistor can be made with buckled electrodes in order to further enhance the stretchability of the final device. The buckling of the electrodes can be accomplished by re-stretching stretchable substrate 206 (panel (b)) and depositing a source electrode 212 and drain electrode 214 over thin film 202 while substrate 206 is in the stretched state (panel (c)). The electrodes comprise a thin layer of an electrically conducting material, such as a thin metal film or foil. The strain in substrate 206 is then released, allowing it to return to its unstretched state and resulting in the buckling of electrodes 212 and 214, as shown in panel (d). Finally, a gate dielectric 216 comprising a polymeric dielectric material is deposited over the conducting channel formed by buckled thin film 202. A dielectric ion gel, which comprises a gelating copolymer swollen with an ionic liquid, may be used as the polymeric dielectric material.

Thin film transistors incorporating the buckled SWCNT films as electronic channels are characterized by high on/off ratios, high mobilities and low operating voltages. By way of illustration, some embodiments of the transistors have an on/off ratio of at least $1 \times 10^4$, an operating voltage of no greater than 2 V and a mobility of at least 10 cm$^2$/(V·S). Moreover, the thin film transistors exhibit stable performance even under high tensile strains. For the purposes of this disclosure, a transistor is considered to have a stable performance in a strained (i.e., stretched) state if its on/off ratio has decreased by no more than 20% relative to its on/off ratio in its unstrained (i.e., unstretched) state. Some embodiments of the stretchable transistors exhibit stable performance under tensile strains of up to 15%, up to 20%, up to 25%, up to 35% or even up to 50%. The performance of the transistors under tensile strain are measured by applying a uniaxial tensile strain by stretching the transistors along the longitudinal direction of the conducting channel (using, for example, a uniaxial stretching machine) and measuring the device characteristics while the transistor is in the stretched state. In addition to being highly stretchable, the transistors show excellent robustness under cyclic mechanical loading. That is, they undergo little performance degradation even after many (e.g., 100+) stretch and release cycles.

EXAMPLES

Example 1

Transistors Having Buckled SWCNT Channels Made with Initial Substrate/SWCNT Strains of Up to 25%

Sample Preparation:

SWCNT solutions were prepared by density gradient ultracentrifugation using high-pressure carbon monoxide conversion (HiPCO) (1 mg/mL) grown SWCNT (Unidym, raw powder). (See, Bindl, D. J.; Safron, N. S.; Arnold, M. S., Dissociating Excitons Photogenerated in Semiconducting Carbon Nanotubes at Polymeric Photovoltaic Heterojunction Interfaces. *Acs Nano* 2010, 4 (10), 5657-5664 and Bindl, D. J.; Wu, M. Y.; Prehn, F. C.; Arnold, M. S., Efficiently Harvesting Excitons from Electronic Type-Controlled Semiconducting Carbon Nanotube Films. *Nano Lett* 2011, 11 (2), 455-460.) The SWCNT powders were sonicated using a horn-tip sonic dismembrator for 45 min in a 10 mg/mL solution of PFO (American Dye Source) in toluene. Bundles and catalyst material were removed through a 1 h centrifugation at 30,000 g in a fixed angle rotor (Eppendorf FA-45-24-11-HS.) The supernatant (top 90% of a 3 cm vial) was extracted and centrifuged for 24 h at 30,000 g. Over this period, the isolated s-SWCNTs moved a total distance of 1 cm, accumulating in a "pellet" with >90% yield. The PFO-rich supernatant was removed and discarded. The pellet was redispersed through a low power, horn microtip sonication in toluene, and repelleted in the centrifuge to remove residual free polymer, resulting in a pellet with a 4:1 weight ratio of PFO:s-SWCNT. A 1:1 weight ratio of PFO:s-SWCNT was achieved by redispersing the pellet into chlorobenzene and repelleting at 30,130 g, resulting in a sedimentation rate of 0.5 cm per 24 h period. The final pellet was redispersed into chloroform to result in a stable, PFO-wrapped s-SWCNT solution.

The ion gel solution was prepared by co-dissolving the triblock copolymer poly(styrene-block methylmethacrylate-block-styrene) (PS-PMMA-PS, Polymer Source Inc. $M_{PS}$=4.3 kg/mol, $M_{PMMA}$=12.5 kg/mol, $M_w$=21.1 kg/mol) and the ionic liquid 1-ethyl-3-methylimidazolium bis(trifluoromethylsulfonyl)imide ([EMIM][TFSI], Sigma Aldrich) in ethyl acetate (Sigma Aldrich). The weight ratio of the polymer, ionic liquid, and solvent were maintained at a ratio of 0.7:9.3:20. This mixture was stirred for 4 h at 1000 rpm. The well-mixed solution was then filtered using 200-nm poly (tetrafluoroethylene) filters before use.

PDMS substrates with thicknesses of 0.5 mm were prepared using Sylgard 184 (Dow Corning) by mixing the base and the curing agent at a ratio of 10:1. The mixture was first placed in a vacuum oven to remove air bubbles, and then thermally cured at 65° C. for 12 h. Rectangular slabs of suitable sizes were cut from the resultant cured piece.

Device Fabrication:

The PFO-wrapped SWCNTs, dispersed in chlorobenzene, were doctor-blade cast onto clean glass on a hot-plate set to 110° C. in a nitrogen glovebox, followed by annealing at 150° C. for 10 min to remove residual solvent. The PDMS substrates were cleaned by sonication in IPA for 5 mins and dried under flowing $N_2$. Then, a PDMS substrate was brought into conformal contact with the SWCNT film on the glass substrate. After brief contact, the PDMS substrate was peeled from the glass and the SWCNT film was transferred onto the PDMS substrate.

To buckle the SWCNT film, the PDMS substrate was stretched and released. The stretching of the PDMS substrate was carried out in a uniaxial stretching machine (Velmex UniSlide; Part #: A2509C-S2.5-LR). The samples were fabricated by forming the SWCNT film on the PDMS substrate prior to stretching the substrate and subsequently stretching the PDMS and the film together to a tensile strain of up to 30%, as illustrated schematically in FIG. 1. A PDMS strip was then brought into conformal contact with SWCNT film/glass substrate. After brief contact, the PDMS substrate was quickly peeled from the glass and transferred onto the PDMS substrate. Releasing the substrate resulted in the buckling of the transferred film. For each sample, the stretch and release cycle was repeated a few times after the initial buckling of the SWCNT films in order to stabilize the buckled structure.

After the SWCNT film was transferred and buckled, the substrate and film were re-stretched to a tensile strain of 15%. Au films with Cr adhesion layers (25 nm/4 nm) were then thermally deposited onto the stretched SWCNT film/substrate through a shadow mask to act as source, drain, and side-gate electrodes. Releasing the strain led to the buckling of the Au/Cr electrodes so that they also became stretchable. Following the release of the strain, the substrates were heated at 60° C. in a glove box and the ion gel solution was drop-cast onto the channel area, as well as the area between the gate electrodes and channels. The devices were then heated at 105° C. in the glovebox for 1 h to remove residual solvent and water. Upon solvent evaporation, PS-PMMA-PS triblock copolymer in the [EMIM][TFSI] ionic liquid formed a well-defined physical gel through noncovalent association of the PS components, which can perform as an excellent dielectric for the transistors.

The device had a channel width and length of 1 mm and 100 μm, respectively. The distance between the gate and channel was about 2 mm. An optical image showed the channel connected by the source and drain electrodes, from which it could be seen that Au/Cr electrodes buckled to form wavy structures along the stretching direction.

Device Characterization:

SEM imaging was conducted using LEO-1550VP field-emission scanning electron microscope at 3 kV of accelerating voltage. The devices were stretched by a uniaxial tensile stage with two sliders driven by a single right and left-hand threaded lead screw. Electrical characteristics were measured on a probe station by a Keithley Sourcemeter (2636A) in air.

Results:

FIG. 5 is an SEM image of a buckled film comprising SWCNTs on a PDMS substrate fabricated using stretching and releasing cycles at a tensile strain of 25%. As shown in the image, periodic wrinkles were found to appear on the surface of the CNT film after the stretching and releasing cycles, in contrast to the flat surface of the film comprising the SWCNTs before stretching (FIG. 4). The wrinkling mechanism may be understood as follows: SWCNTs or SWCNT bundles slide between each other upon stretching the substrate, but cannot slide back because of the friction force between the them. As a result, the SWCNT film buckles out of plane as a whole, forming surface wrinkles. Care should be taken not to over-stretch the film to avoid the formation of cracks, which would affect the performance of the transistors. In this example, the largest tensile strain of the SWCNT film/substrate was controlled to be 25% to ensure no cracks were generated.

Figure 6:
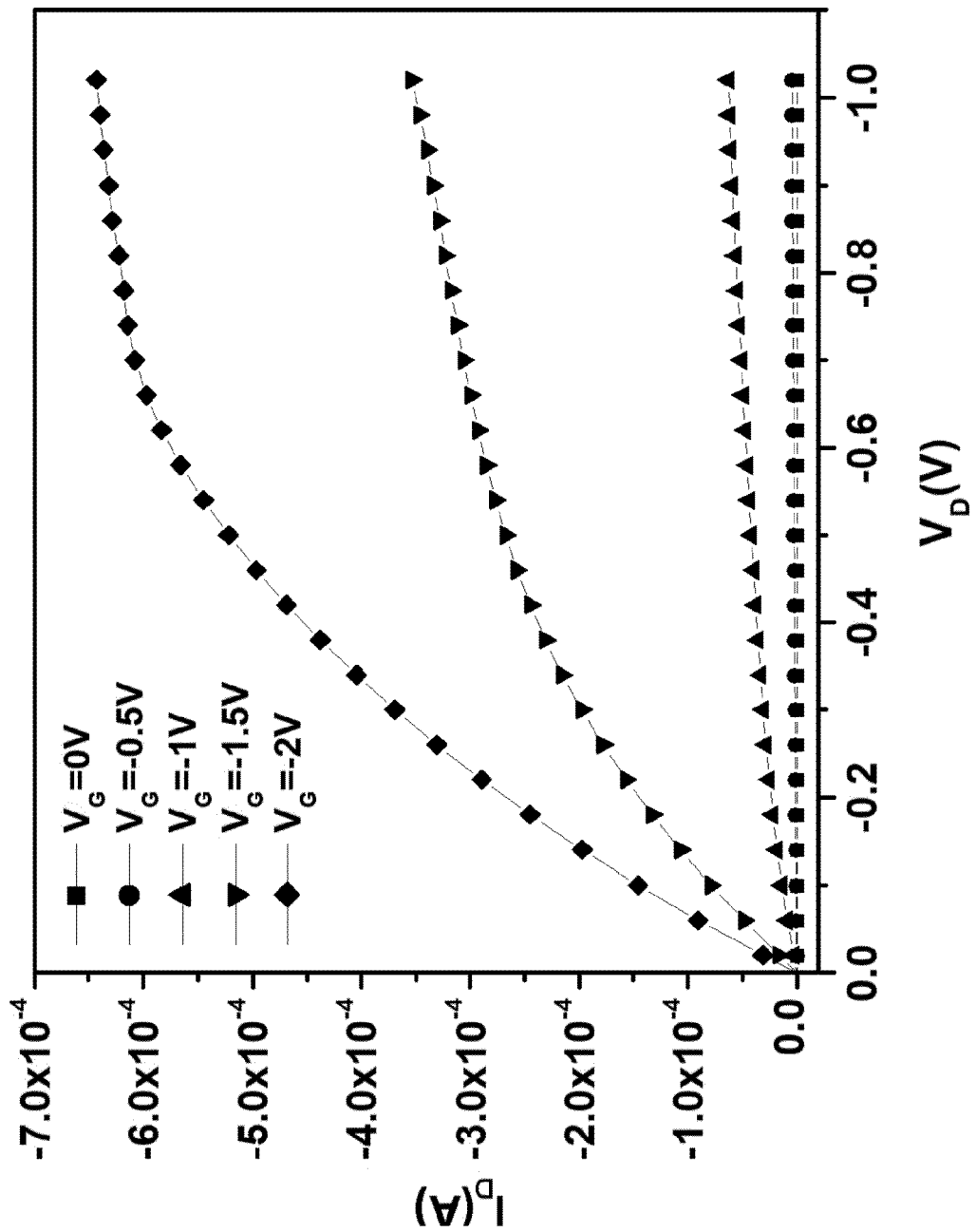
FIG. 6. Typical output characteristics of a transistor comprising a buckled SWCNT film as a conductive channel, wherein the film was buckled on a substrate stretched to a tensile strain of 25%.
Figure 7:
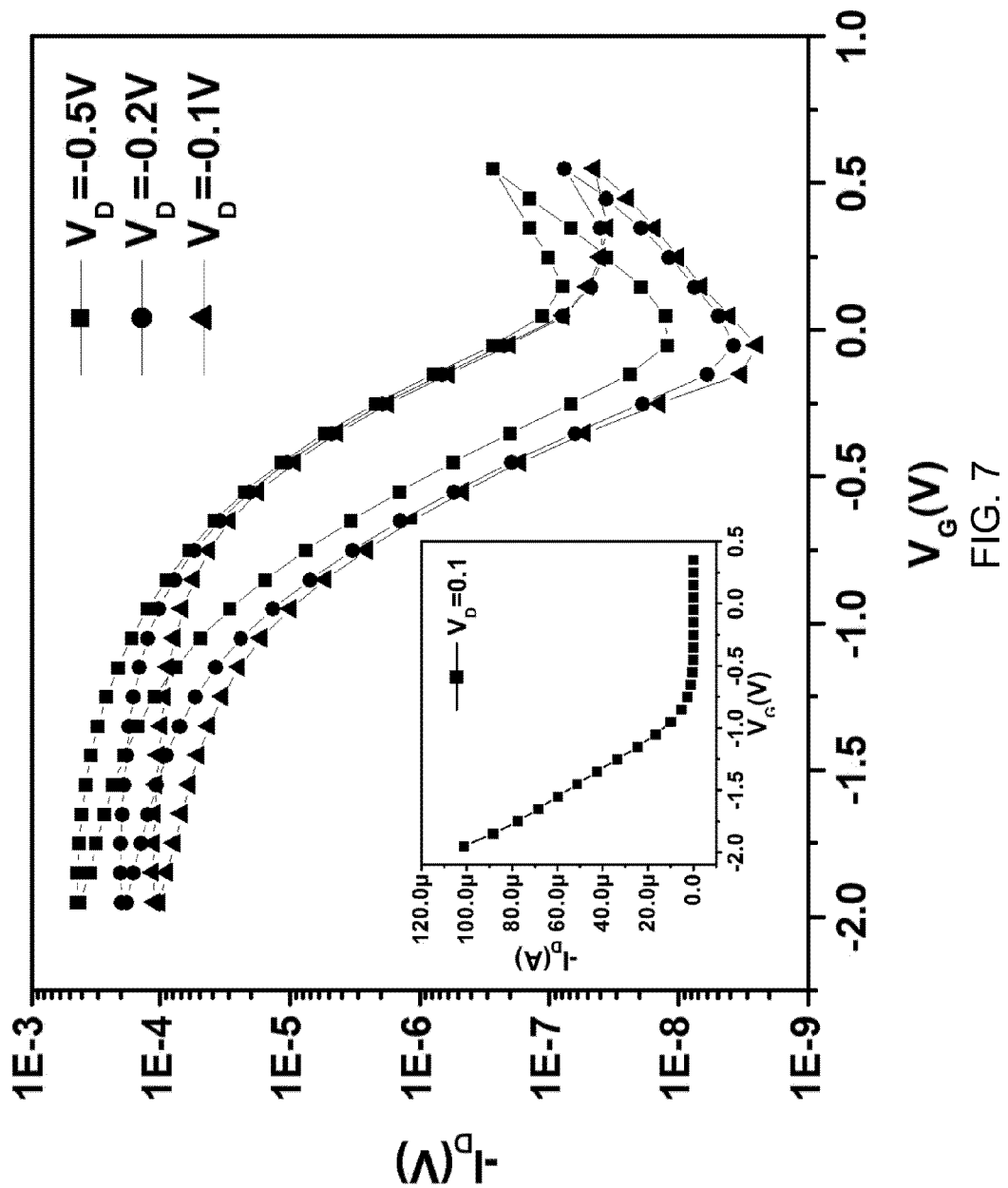
FIG. 7. Typical transfer characteristics of an unstrained transistor in accordance with Example 1.

The output characteristics of the transistor comprising a buckled film of SWCNTs on a PDMS substrate fabricated using stretching and releasing cycles at a tensile strain of 25% at five different gate voltages ($V_G$) are presented in FIG. 6. The device showed the expected gate modulation of the drain current ($I_D$) in both the linear and saturation regimes. Notably, large saturation currents were obtained at very low gate and drain biases (e.g. $I_D$=~640 μA at $V_G$=−2 V and $V_D$=−1 V), owing to the large capacitance of the ion gel gate dielectric. From the transfer characteristics in FIG. 7, it can be seen that the transistor performed as a typical p-type field-effect transistor (FET) operating at a low gate voltage (0.6 V). The on/off current ratio reached $4 \times 10^5$, indicating a high switching property. The field-effect mobility was calculated from the linear regime of the transfer characteristics (inset of FIG. 7) using the following equation $$I_D = \mu W/L \, C_i V_D (V_G - V_{th}),$$

where $I_D$ is the drain current, μ is the field-effect mobility, W is the channel width, L is the channel length, $V_D$ is the drain voltage, $C_i$ is the specific capacitance of the dielectric, $V_G$ is the gate voltage, and $V_{th}$ is the threshold voltage. Specific capacitance of the ion gel was measured to be about 8.7 μF/cm$^2$ at 20 Hz by a LCR meter. The calculated mobility of the transistor was 10.6 cm$^2$/(V·S) at $V_D$=−0.1V. Small diameter SWCNTs were used for this device. The mobility could be increased by using CNTs with larger diameters.

Figure 8:
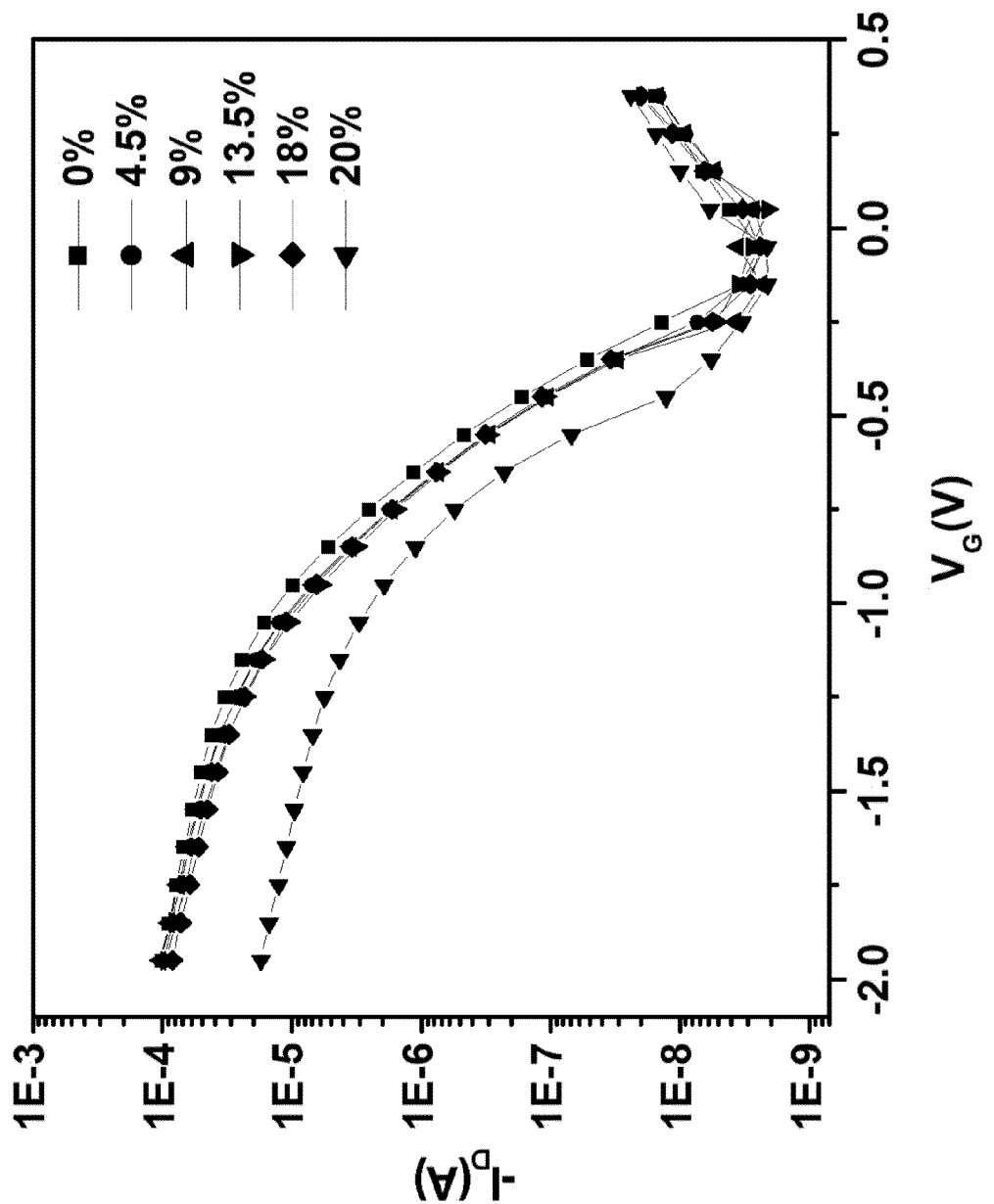
FIG. 8. Typical transfer characteristics (constant current) of a transistor measured under strains up to 20%, as described in Example 1.
Figure 9:
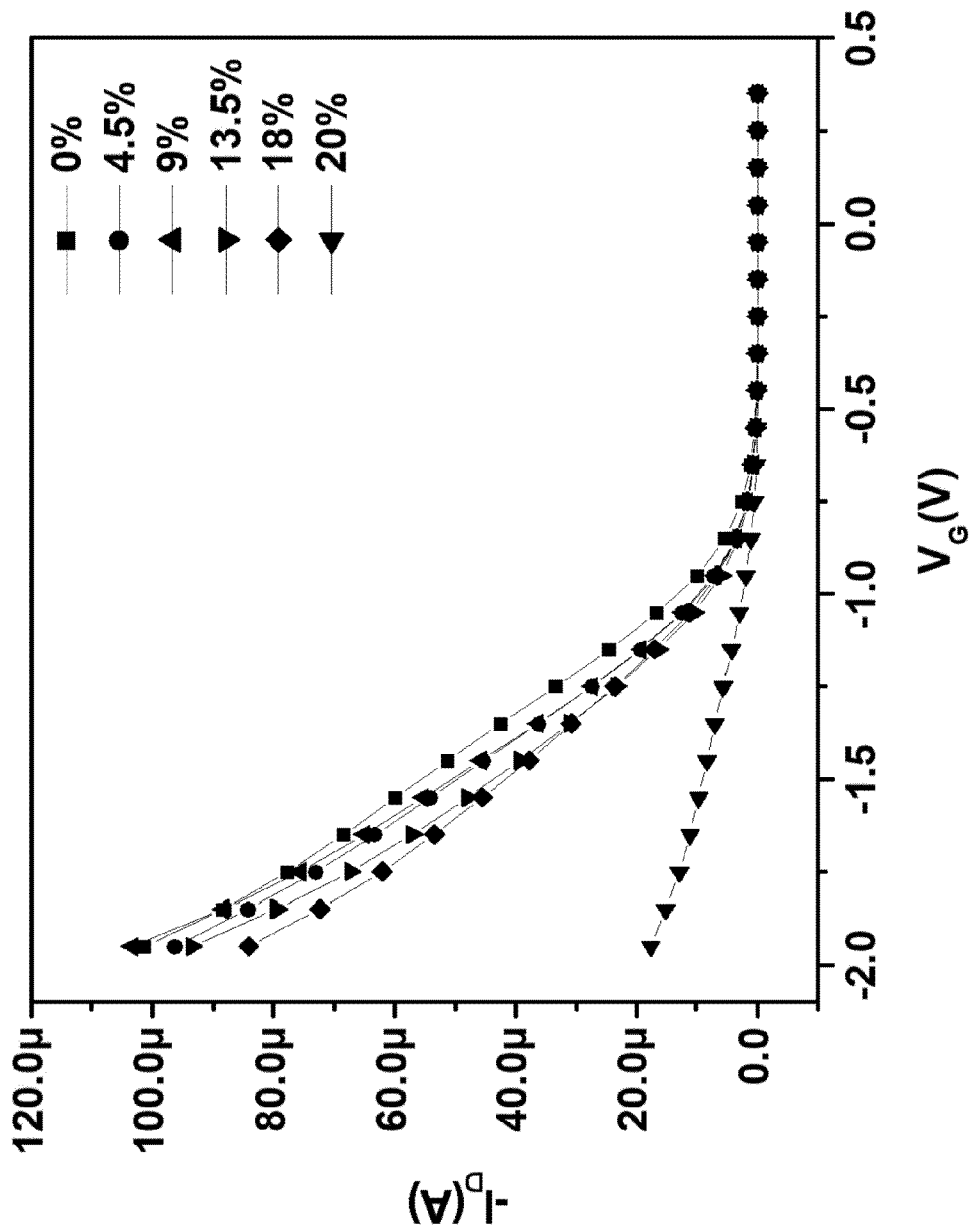
FIG. 9. Typical transfer characteristics (constant drain-source voltage; $V_D$=−0.1V) of a transistor measured under strains up to 20%, as described in Example 1.
Figure 10:
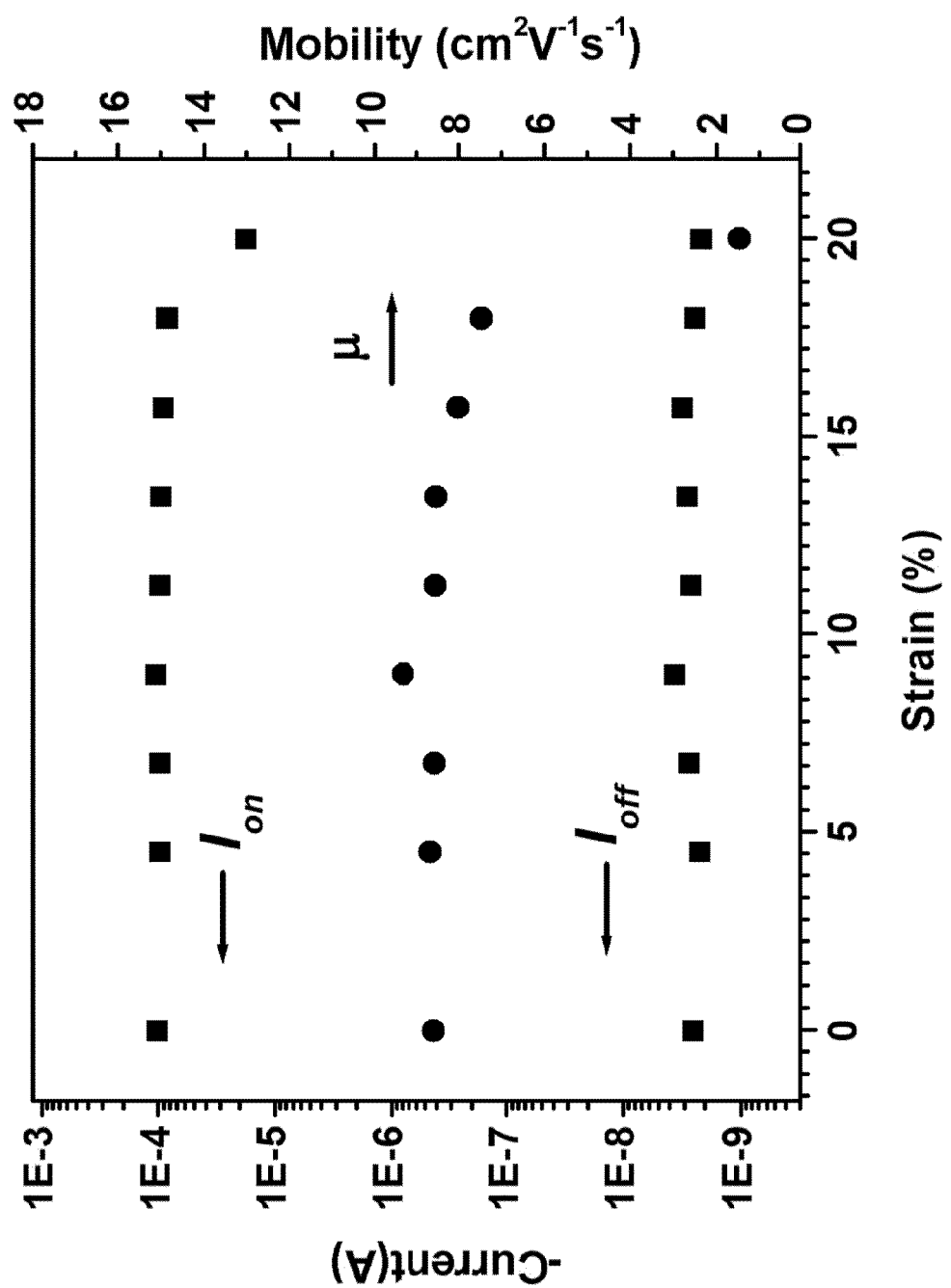
FIG. 10. On and off currents and mobility of the transistor as a function of applied strain, as described in Example 1.
Figure 11:
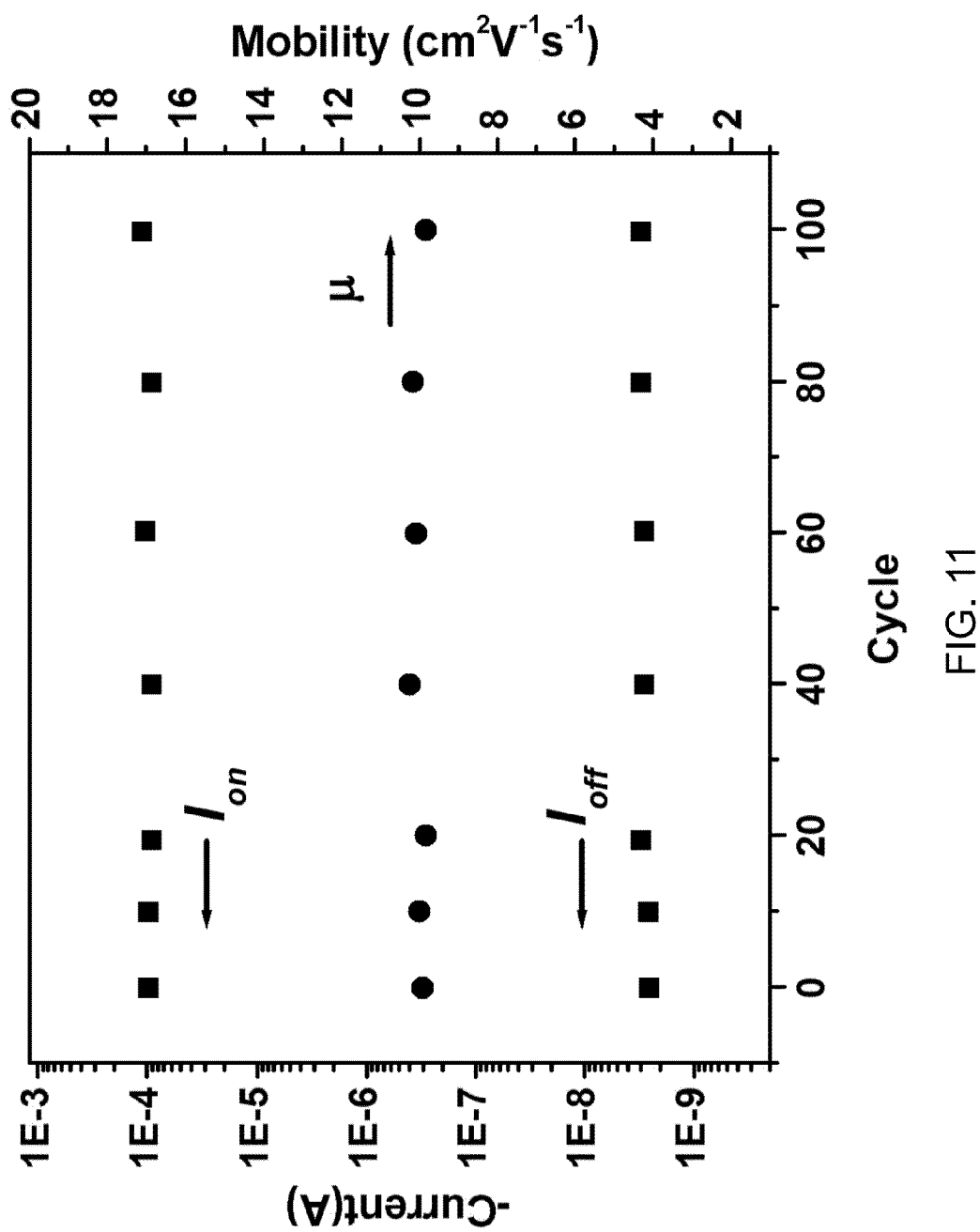
FIG. 11. On and off currents and mobility of another transistor as a function of stretching and releasing cycle in the strain range of 10%, as described in Example 1.

To test the stretchability the fabricated transistors, uniaxial tensile strain was applied to the devices by stretching the PDMS along the longitudinal direction of the channel. The transfer characteristics were measured simultaneously during the stretching process. FIGS. 8 and 9 present typical transfer characteristics of the transistors as a function of the applied strains. The devices exhibited fairly stable operation under strains up to 18%; off-currents were almost constant while on-current and transconductance values were reduced by 17% and 13% with respect to the unstrained values, respectively (FIG. 8). To correctly estimate the mobility of the transistors during the stretching process, the capacitance change of the casted ion gel versus strain was also measured. From this it was found that the capacitance of ion gel gradually decrease with the applied tensile strains. Based on the capacitance measurement result, the mobility of the transistor at different strains was calculated and is plotted in FIG. 10, which shows some fluctuation but no degradation under stretching up to 18%. When the applied strain increased to 20%, the values for on-current and mobility both decreased significantly, by roughly 80%. Further increasing the strain accelerated the degradation of the device performance. To study the fatigue properties of the devices, a maximum of 100 stretching/releasing cycles in the strain range of 0-10% were performed on another device. Although the on/off ratio, and mobility of the device fluctuated to some degree, the device still showed good performance without any electrical or mechanical damage observed, indicating the excellent stability (FIG. 11).

The transistors are composed of three stretchable electronic components including a dielectric layer, electrodes and a SWCNT-based channel. Therefore, the stretchability of all three components in the devices was examined for the purpose of interpreting the mechanism behind the electrical response of the stretchable transistors to mechanical strains. It was found that the ion gel could be stretched to as high as 47.5% strain while the capacitance decreased by only 23%. The capacitance recovered when the strain was released. For each of the source, drain and gate electrodes, buckled Au/Cr films were used. The resistance change of the buckled Au/Cr films was measured as a function of the applied strain. With a pre-strain of 15%, the buckled Au/Cr film exhibited stable resistance up to a strain of 20%, indicating it is an excellent stretchable component for the transistors.

Figure 12:
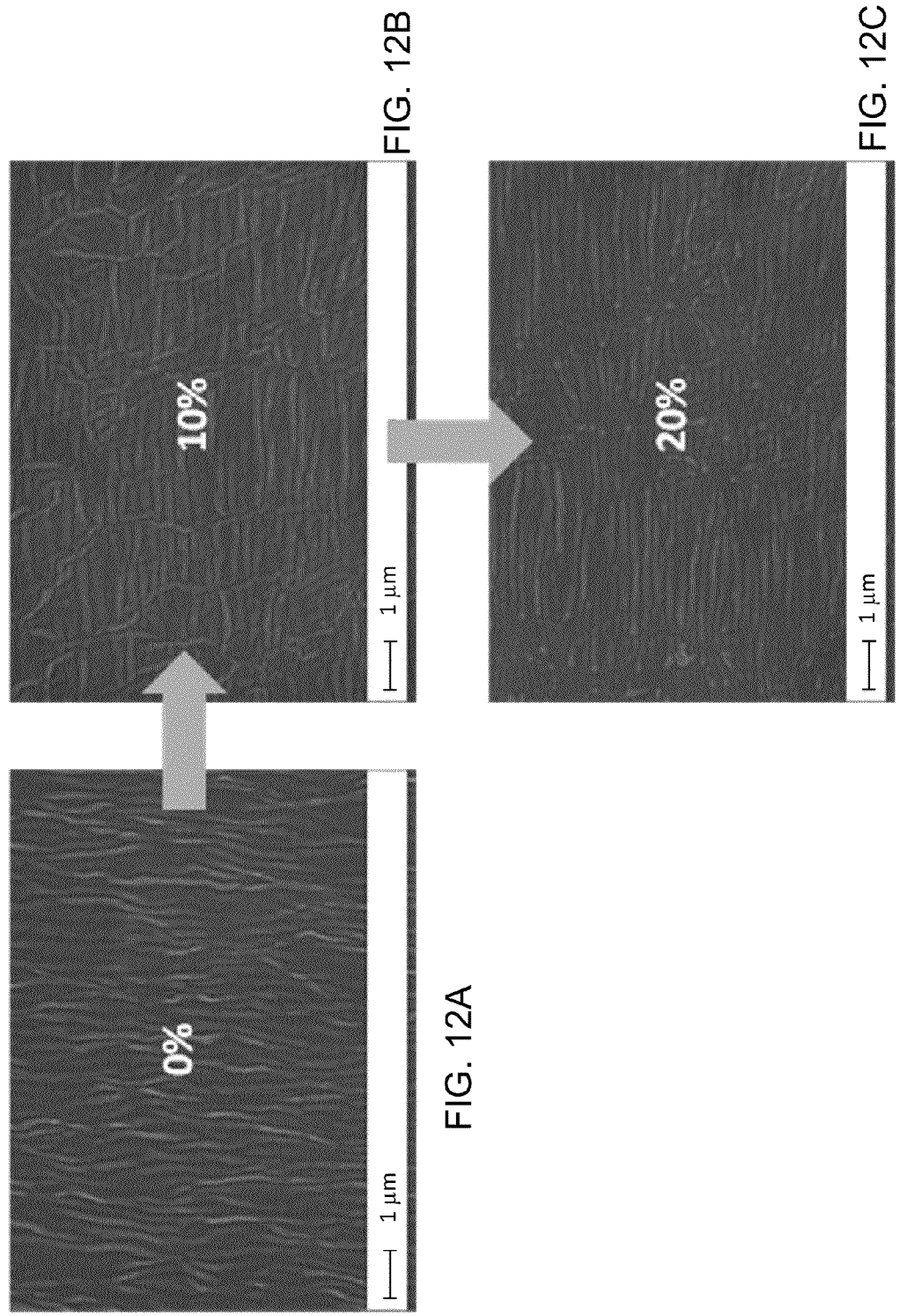
FIG. 12(A). SEM images of a buckled SWCNT film at a strain of 0%, as described in Example 1.
FIG. 12(B). SEM images of the buckled SWCNT film at a strain of 10%, as described in Example 1.
FIG. 12(C). SEM images of the buckled SWCNT film at a strain of 20%, as described in Example 1.
Figure 13:
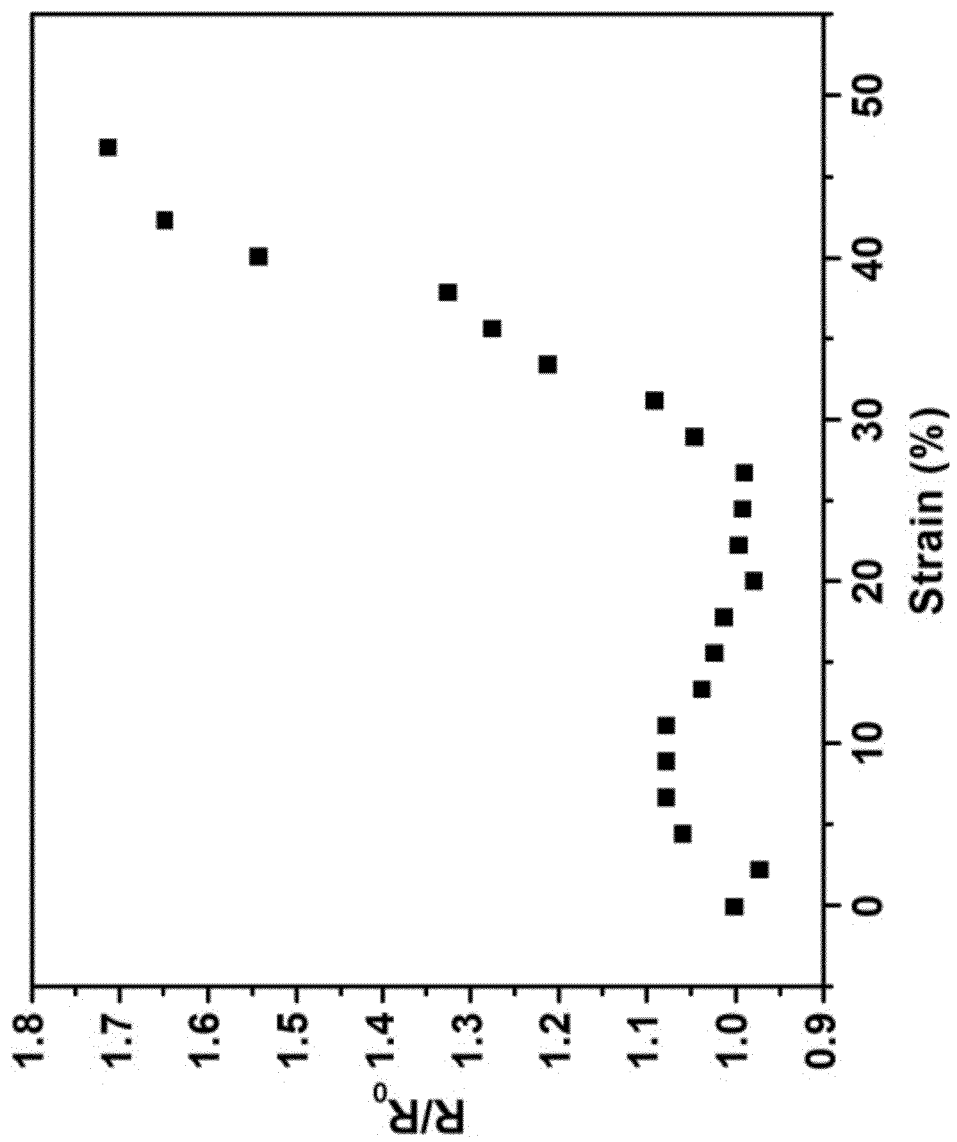
FIG. 13. Resistance change of a SWCNT film as a function of applied strain, as described in Example 1.

Regarding the stretchability of the SWCNT-based channel, both the surface morphology and electrical properties of SWCNT film in the channel area were characterized during the stretching process. FIGS. 12(A)-(C) show the SEM images of the SWCNT film at strains of 0%, 10% and 20%, respectively. It can be seen that the initially presented surface wrinkles along the length direction gradually disappeared with the increase of strain. Simultaneously, similar surface wrinkles along the other direction were formed due to the compressive stress. The normalized resistance of the buckled SWCNT film as a function of strain is plotted in FIG. 13. It can be seen that the resistance was almost stable under tensile strains up to 25%, which was also the largest strain applied when stretching the SWCNT film. When the film was stretched, the dominant structural change was the straightening (along the channel length direction) and formation (perpendicular to the channel length direction) of the periodic, wavy structure (including individual SWCNTs and the overlaps between them), which should cause no resistance change.

In summary, highly stretchable transistors were developed based on buckled SWCNT films with ion gels as dielectrics. The resulting devices exhibited an excellent on/off ratio of $4 \times 10^4$ and a low operating voltage of less than 2 V. The performance of devices remained stable in a large tensile strain range of 0-35%.

Example 2

Transistor Having Buckled SWCNT Channel Made with a Substrate Pre-Strain of Up to 50%

Sample Preparation and Device Fabrication:

SWCNT solutions, ion gel solutions and PDMS substrates were made according to the methods described in Example 1, above. These solutions and substrates were then used to fabricate stretchable transistors with buckled channels and buckled Au/Cr source, drain and gate electrodes using the device fabrication processes described in Example 1, above. However, in this example, the PDMS strip was first pre-stretched to a tensile strain of 50% (using the process illustrated in FIG. 3) and then brought into conformal contact with the SWCNT film/glass substrate while it is stretched state. After brief contact, the PDMS substrate was quickly peeled away from the glass and the SWCNT film was transferred onto the PDMS substrate. The pre-strain was then released, resulting in the buckling of the transferred SWCNT film.

Figure 14:
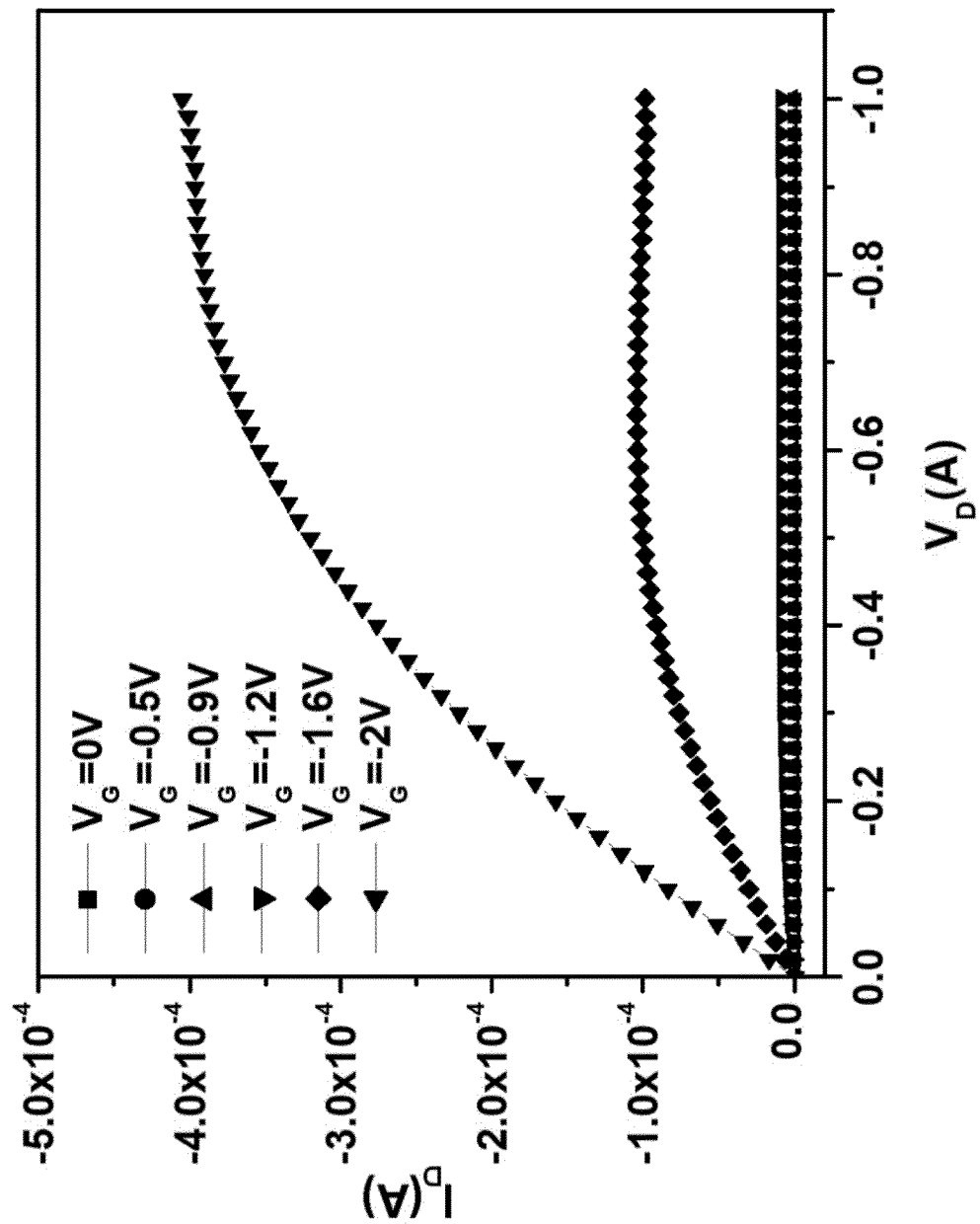
FIG. 14. Typical transfer characteristics of an unstrained transistor in accordance with Example 2.
Figure 15:
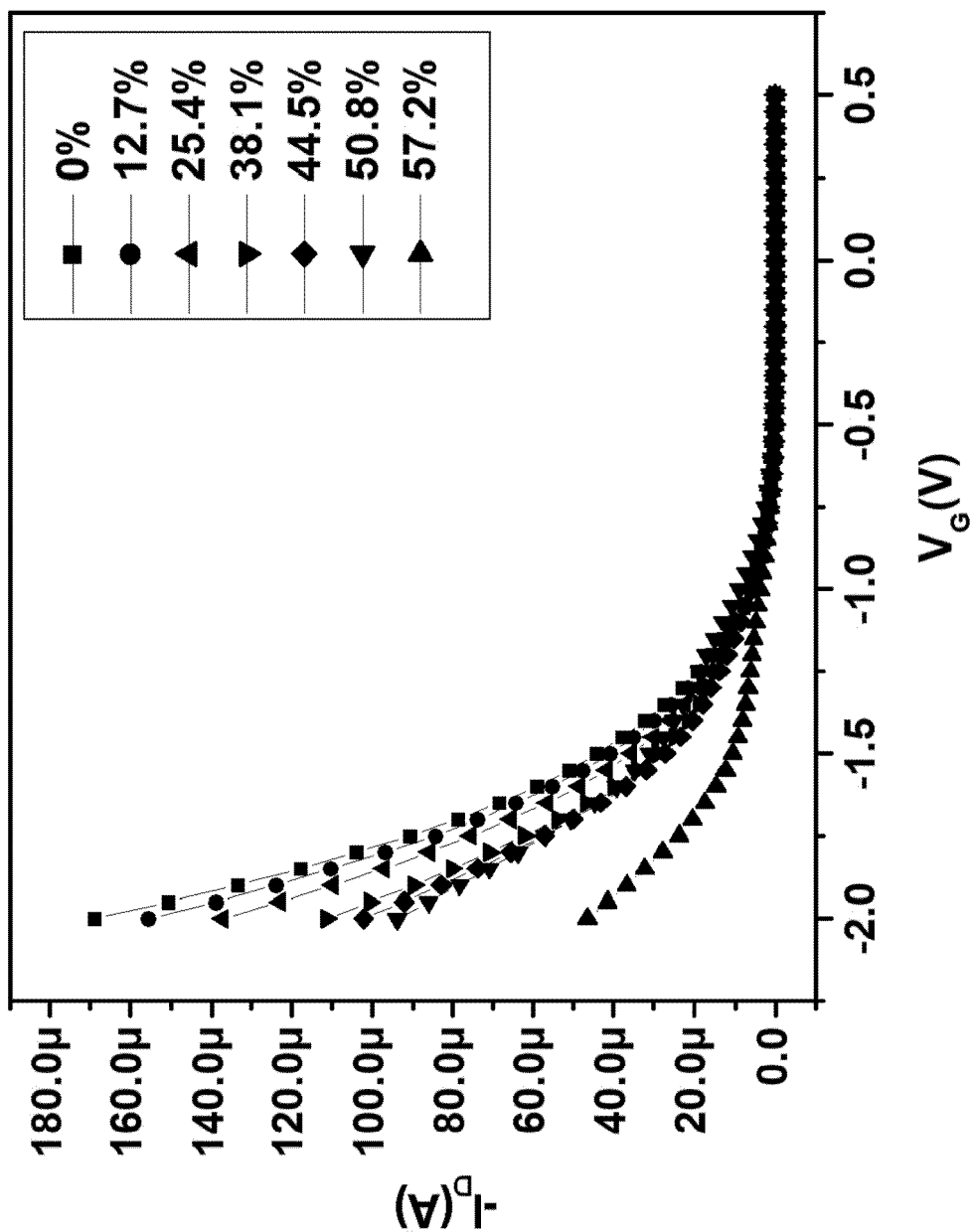
FIG. 15. Typical transfer characteristics (constant drain-source voltage; $V_D$=−0.5V) of a transistor measured under strains up to 57.2%, as described in Example 2.
Figure 16:
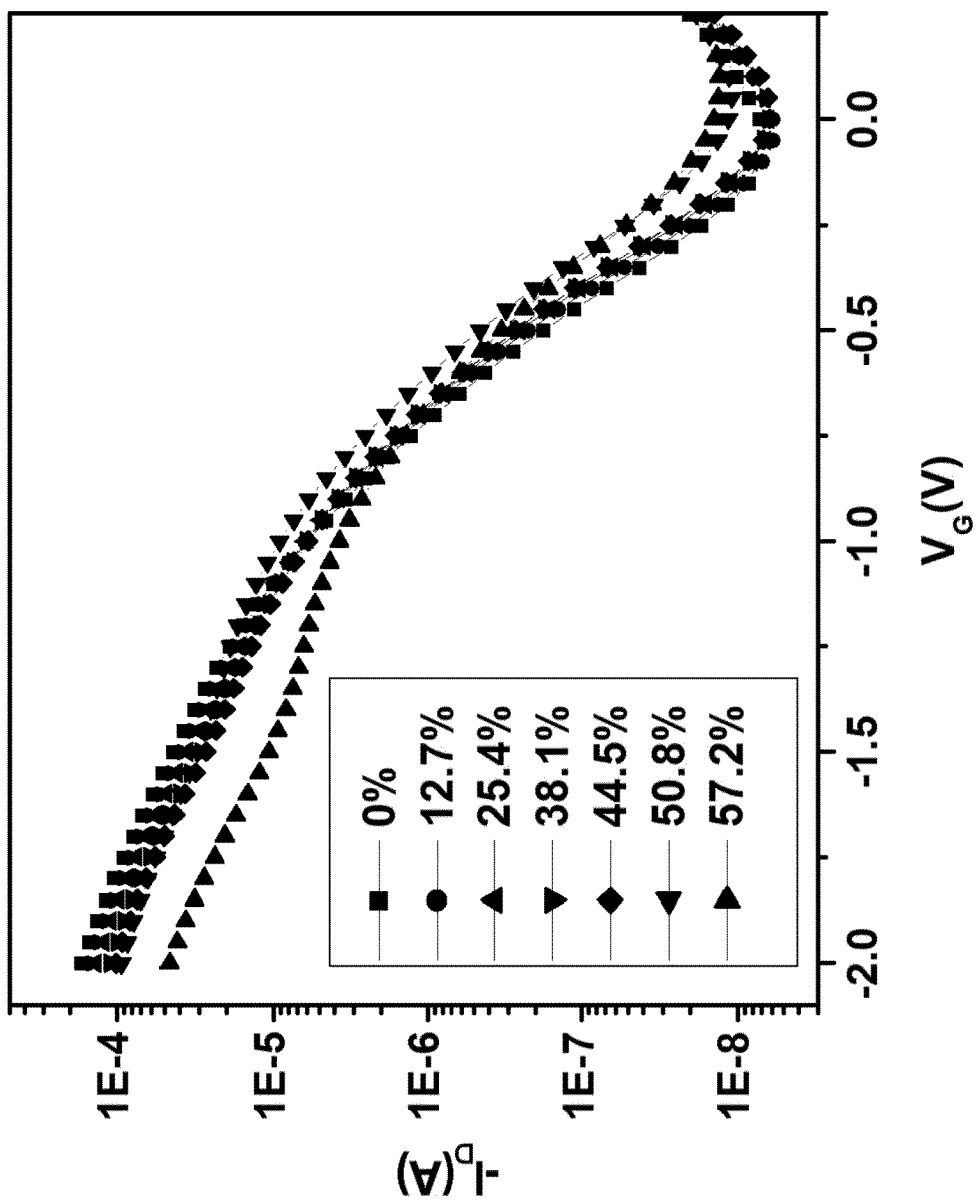
FIG. 16. Typical transfer characteristics (constant current) of a transistor measured under strains up to 57.2%, as described in Example 2.

Results:

The output characteristics of the unstretched transistor at five different gate voltages ($V_G$) are presented in FIG. 14. The graphs in FIGS. 15 and 16 show the transfer characteristics ($V_D$=−0.1V) of the transistor under strain up to 57.2%.

Figure 17:
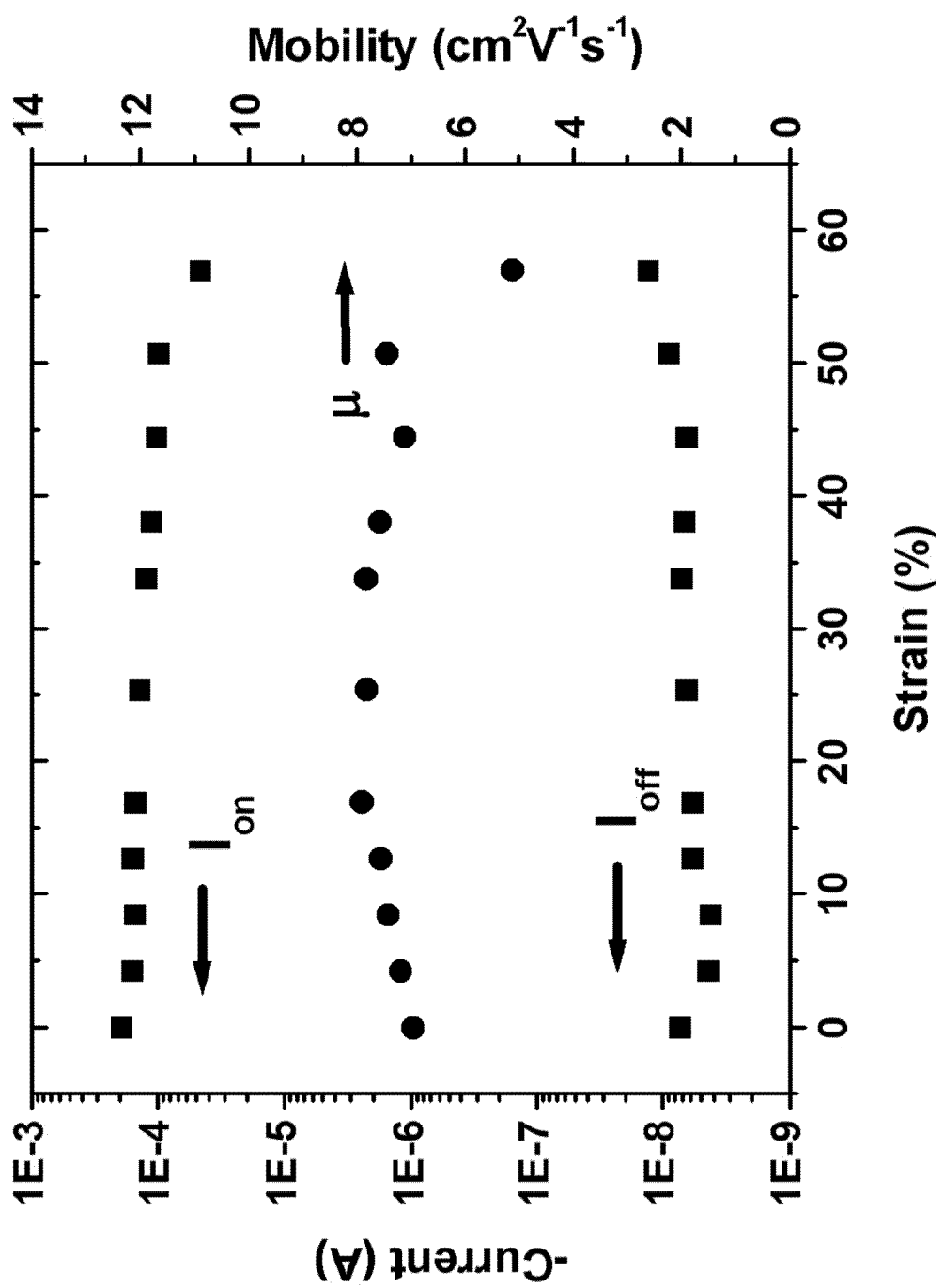
FIG. 17. On and off currents and mobility as a function of applied strain for the transistor of Example 2.
Figure 18B:
FIG. 18(B). SEM images of the buckled SWCNT film at a strain of 25%, as described in Example 2.
Figure 18D:
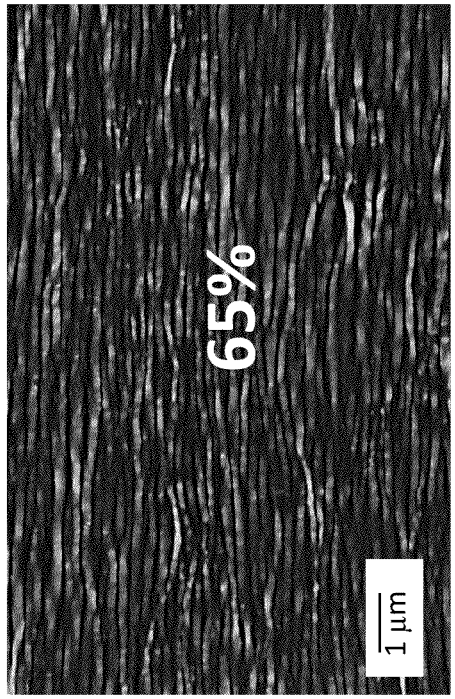
FIG. 18(D). SEM images of the buckled SWCNT film at a strain of 65%, as described in Example 2.
Figure 18A:
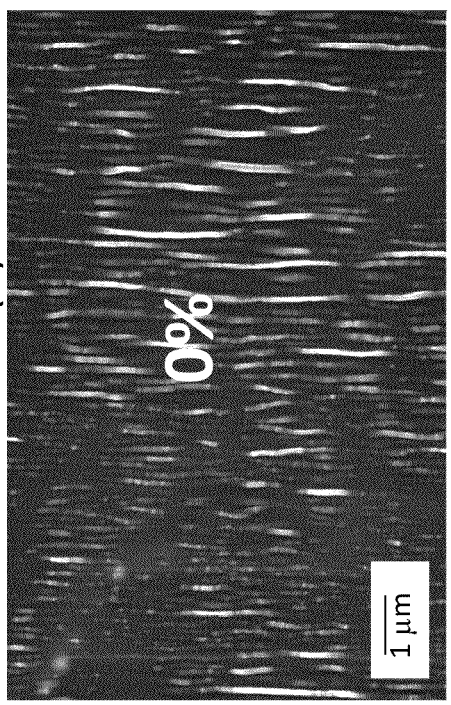
FIG. 18(A). SEM images of a buckled SWCNT film at a strain of 0%, as described in Example 2.
Figure 18C:
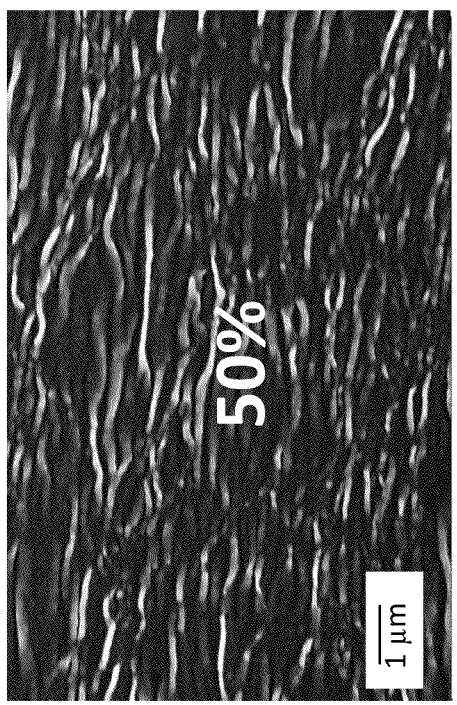
FIG. 18(C). SEM images of the buckled SWCNT film at a strain of 50%, as described in Example 2.

The on and off currents and the mobility of the transistor, based on capacitance measurements, at different strains was calculated and is plotted in FIG. 17, which shows some fluctuation but no degradation under stretching up to 50.8%.

The surface morphology of SWCNT film of the transistor was also studied in the channel area during the stretching process. FIGS. 18(A)-(D) show the SEM images of the SWCNT film in the transistor at strains of 0%, 25%, 50% and 65%, respectively. It can be seen that the initially presented surface wrinkles along the length direction gradually disappeared with the increase of strain. Simultaneously, similar surface wrinkles along the other direction were formed due to the compressive stress.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A stretchable transistor comprising:
   a source electrode;
   a drain electrode;
   a conducting channel disposed between the source electrode and the drain electrode, the conducting channel comprising a buckled film, the buckled film comprising single-walled carbon nanotubes;
   a gate dielectric comprising a stretchable polymeric dielectric material disposed over the conducting channel;
   a gate electrode in electrical communication with the conducting channel; and
   a stretchable substrate comprising an elastic material disposed under the conducting channel.

2. The transistor of claim 1, wherein at least one of the source electrode, the drain electrode and the gate electrode comprise buckled metal films.

3. The transistor of claim 2, wherein each of the source electrode, the drain electrode and the gate electrode comprise buckled metal films.

4. The transistor of claim 3, wherein the stretchable polymeric dielectric material is an ion gel.

5. The transistor of claim 1, wherein the stretchable polymeric dielectric material is an ion gel.

6. The transistor of claim 1, characterized in that it provides stable performance while stretched to a tensile strain of up to 25%.

7. The transistor of claim 1, characterized in that it provides stable performance while stretched to a tensile strain of up to 50%.

8. A method of fabricating a stretchable transistor, the method comprising:
   applying a film comprising single-walled carbon nanotubes onto the surface of a stretchable substrate comprising an elastic material;
   stretching the stretchable substrate;
   allowing the stretched substrate with the film comprising the single-walled carbon nanotubes applied thereon to return to its un-stretched state, whereby the film comprising the single-walled carbon nanotubes becomes buckled;
   depositing a film of electrically conducting material over a portion of the stretchable substrate and the film comprising single-walled carbon nanotubes to form a source electrode;
   depositing a film of electrically conducting material over another portion of the stretchable substrate and the film comprising single-walled carbon nanotubes to form a drain electrode; and
   depositing a film of a stretchable polymeric dielectric material over the film comprising the single-walled carbon nanotubes between the source electrode and the drain electrode to form a gate dielectric.

9. The method of claim 8, wherein the film comprising single-walled carbon nanotubes is applied onto the surface of a stretchable substrate while the stretchable substrate is in a stretched state.

10. The method of claim 8, wherein the film of electrically conducting material that forms the source electrode and the film of electrically conducting material that forms the drain electrode are deposited while the stretchable substrate is in a stretched state, such that the films of electrically conducting material become buckled when the stretchable substrate is returned to its un-stretched state.

11. The method of claim 10, wherein the stretchable polymeric dielectric material is an ion gel.

12. The method of claim 8, wherein the stretchable polymeric dielectric material is an ion gel.

13. The method of claim 8, wherein stretching the stretchable substrate comprises stretching the stretchable substrate up to a tensile strain of no greater than 60%.

14. The method of claim 13, wherein stretching the stretchable substrate comprises stretching the stretchable substrate up to a tensile strain in the range from about 15% to about 60%.

* * * * *